United States Patent [19]

McClure et al.

[11] Patent Number: 4,826,785

[45] Date of Patent: May 2, 1989

[54] METALLIC FUSE WITH OPTICALLY ABSORPTIVE LAYER

[75] Inventors: Paul J. McClure; Robert E. Jones, Jr., both of Colorado Springs, Colo.

[73] Assignee: INMOS Corporation, Colorado Springs, Colo.

[21] Appl. No.: 7,065

[22] Filed: Jan. 27, 1987

[51] Int. Cl.⁴ .............................................. H01L 21/82
[52] U.S. Cl. ..................................... 437/174; 437/16; 437/173; 437/194; 437/192; 437/228; 437/921; 148/DIG. 93; 148/DIG. 55
[58] Field of Search ............... 437/922, 173, 174, 194, 437/197, 198, 199, 190, 192, 245, 246; 148/DIG. 55

[56] References Cited

U.S. PATENT DOCUMENTS

| | | | |
|---|---|---|---|
| 3,619,725 | 11/1971 | Saden | 148/DIG. 55 |
| 3,930,304 | 1/1976 | Keller et al. | 148/DIG. 55 |
| 4,410,622 | 10/1983 | Dalal et al. | |
| 4,431,708 | 2/1984 | Carver et al. | 427/162 |
| 4,561,906 | 12/1985 | Calder et al. | 437/235 |
| 4,602,420 | 7/1986 | Saito | 148/DIG. 55 |

FOREIGN PATENT DOCUMENTS

| | | | |
|---|---|---|---|
| 0000157 | 1/1983 | Japan | 437/922 |
| 0067042 | 4/1983 | Japan | 437/922 |
| 0060560 | 4/1983 | Japan | 437/922 |
| 0124145 | 7/1984 | Japan | 148/DIG. 55 |
| 0018933 | 1/1985 | Japan | 148/DIG. 55 |
| 0062137 | 4/1985 | Japan | 148/DIG. 55 |

Primary Examiner—Brian E. Hearn
Assistant Examiner—Kevin McAndrews
Attorney, Agent, or Firm—Edward D. Manzo

[57] ABSTRACT

A metallic interconnect includes a fuse portion that is readily vaporized upon exposure to the radiant energy of a laser. A layer of optically absorptive material is formed on top of an aluminum based metallic interconnect and together they are formed by a photolithographic and etch technique into a fuse portion. A low energy laser having a Gaussian energy distribution focused on the absorptive layer produces heat in the absorptive layer. The heat is transferred to the underlying aluminum based interconnect. The concentration of energy made possible by the absorptive layer allows the low energy laser to blow the fuse thereby producing an electrical open in the interconnect without damaging surrounding silicon substrate and/or polysilicon structures below or nearby the metal fuse.

18 Claims, 2 Drawing Sheets

METALLIC FUSE WITH OPTICALLY ABSORPTIVE LAYER

FIELD OF THE INVENTION

The present invention relates generally to integrated circuit fabrication and especially to establishing a metallic fuse incorporated into a metallic interconnect line for an integrated circuit. More particularly, this invention combines a metallic interconnect member with a layer of optically absorptive material on top, which combination provides a metal based fuse for integrated circuits that can be blown by a low power laser.

BACKGROUND OF THE INVENTION

This invention relates to integrated circuit fabrication and a process for manufacturing an aluminum based fuse for use in metal interconnects for integrated circuits.

Integrated circuits consist of thousands of individual elements joined together on a chip by electrically conductive "interconnects". It has been found that the ability to alter interconnects on a chip after standard processing is completed provides great improvement in chip yield (number of working chips) and chip customization (i.e., modifying a chip to do a specific function). A technique widely practiced in the industry involves using light from a laser to vaporize (blow) segments of interconnects—referred to as fuses—formed from polysilicon, thereby forming an "open" that eliminates the electrical connection provided by the interconnect.

The potential for more efficient circuit design, simplified processing, and improved reliability have made metal fuses more desirable than fuses of polysilicon. The most common metal interconnects are of aluminum or aluminum alloys such as, for example, Al-Si, Al-Cu, and Al-Si-Cu. The use of aluminum or aluminum alloys for metal interconnects, however, has made laser blown metal fuses impractical. Such materials are not easily damaged by laser radiation because they absorb only a small portion (typically 5-20%) of the incident radiant energy, as opposed to the single crystal and polycrystalline silicon that absorb a much larger portion of the incident energy (typically 60% or more). As a result, cutting metal fuses requires a much higher energy laser beam than is required to blow polysilicon fuses. High energy lasers, however, are likely to damage the silicon substrate and/or polysilicon structures below or nearby the metal fuse. M. Mitani et al., "Laser Cutting of Aluminum Thin Film With No Damage to Under-Layers," *Ann. CIRP*, Vol. 28/1, pp. 113-116 (1979). In addition, investigators have found that metal fuses tend to splatter conductive material when blown by a laser. This creates a problem as splattered conductive material can damage nearby circuit elements or produce electrical shorts between elements. J. Posa, "Redundancy—What To Do When The Bits Go Out," *Electronics*, July 28, 1981, pp. 117-120.

In order to overcome these problems, aluminum fuses have been used with large spacings between them (spacings of 15 microns). D. Still, "A 4ns Laser-Customized PLA With Pre-Program Test Capability," *Tech. Dig. IEEE ISSCC*, pp. 154-155 (1983). Such large spacing, however, is not compatible with the present trend in increasing the density of integrated circuits on a chip.

Another technique for blowing aluminum fuses involves using a rectangular aperture to form a reduced image of a laser beam with a flat energy distribution rather than the typical Gaussian distribution. For this technique, the width of the image must be set to the same width as the fuse in order to prevent damage to the silicon substrate and/or polysilicon structures below or nearby the metal fuse. H. Yamaguchi et al., "Laser Cutting of Aluminum Stripes For Debugging Integrated Circuits," *IEEE J. Solid-State Circuits*, Vol. SC-20, pp. 1259-1264 (1985). Such a method, however, requires that the size of the projected laser image and the alignment of the laser image to the fuse be precisely controlled in order to prevent damage to underlayers. This precise control is not practical in a manufacturing environment. As a result, metal fuses have not been feasible for commercial application.

SUMMARY OF THE INVENTION

In accordance with the present invention, the disadvantages of prior metallic fuses for integrated circuits, as discussed above, have been overcome.

The metallic fuse of the present invention, in one of its aspects, includes the use of a layer of an optically absorptive material as a coating on top of an aluminum based interconnect member patterned as a fuse. The optically absorptive layer allows a lower energy laser beam with a Gaussian energy distribution output to be used to blow the fuse, thus reducing or eliminating the danger of damage to other structures nearby and below the fuse. Also, the shape, the energy distribution, and the alignment of the laser spot to the fuse are far less critical since the energy of the laser is not such that damage to the substrate and nearby structures is likely to occur.

Materials for the absorptive top layer should be selected to be optically absorptive at the frequency produced by the laser selected for use in the fuse blowing process. In addition, the optically absorptive material preferably will have a higher boiling point than the metal forming the underlying metal fuse portion.

To blow a selected fuse, a laser is directed at the optically absorptive layer. The energy from the laser is absorbed in the top layer causing the fuse to heat up. Heat conduction from the absorption layer then causes the rest of the underlying metallic fuse portion to heat up and eventually melt. At the same time, the surface temperature of the fuse rises until the metal fuse material begins to evaporate. If the surface temperature rises fast enough, the vapor pressure will rise quickly and the melted fuse material will be removed explosively by the increased vapor pressure. The use of the thin, high-temperature optically absorptive coating on top of the interconnect member forming the fuse portion acts as a cap to prevent evaporation until the vapor pressure of the material below the cap is very high. This results in a more explosive reaction and therefore more complete removal of the material forming the fuse.

BRIEF DESCRIPTION OF THE DRAWINGS

Other objects and advantages of the invention will become apparent upon reading the following detailed description with reference to the drawings. Throughout the drawings, like reference numerals refer to like parts.

DETAILED DESCRIPTION OF THE PREFERRED EMBODIMENTS

The way in which an exemplary metallic fuse is constructed and subsequently laser blown will now be described with reference to FIGS. 1–5. These figures illustrate the various stages of metallic fuse construction according to the present invention and method of fabrication.

Figure 1:
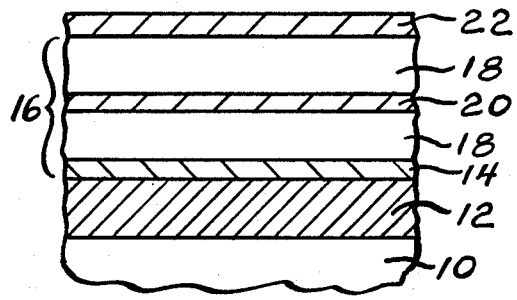
FIGS. 1-2 illustrate in cross sectional views the sequential construction of an exemplary metallic fuse fabricated in accordance with the present invention.

Referring first to FIG. 1, there is shown a substrate 10 beneath a dielectric region 12, which is formed in a conventional manner. Region 12 may be a thermally grown silicon dioxide or a doped or undoped silicon dioxide, silicon oxynitride, or silicon nitride deposited by any of several conventional techniques including chemical vapor deposition, plasma enhanced chemical vapor deposition, spin-on glass or sputtering. Consistent with the present invention, in some applications, the dielectric region 12 can be a combination of two or more dielectric layers. In general, region 12 may contain patterned circuit elements (not shown) formed from deposited layers of semiconductor or metal. In the preferred embodiment, dielectric region 12 includes a thermally grown silicon dioxide on silicon substrate 10. Over the silicon dioxide is formed a chemical vapor deposited borophosphosilicate glass layer.

In the preferred embodiment, a diffusion barrier 14 between 200 and 2000 angstroms thick is then established on top of dielectric region 12. Diffusion barrier 14 may comprise any acceptable material, such as, for example, a transition metal alloy (e.g., Ti-W). In the embodiment illustrated, diffusion barrier 14 is formed of titanium nitride.

Following standard wafer processing techniques, a metal interconnect 16 is established on barrier 14. Metal interconnect 16 is, generally, according to the present invention, between 5000 and 15,000 angstroms thick and may comprise pure aluminum, one of the standard alloys of aluminum (such as, for example, Al-Si, Al-Cu, or Al-Si-Cu), or an alloy of aluminum containing a transition metal (such as, for example, Al-Si-Ti). In the preferred embodiment, however, interconnect 16 comprises a layered structure having an aluminum based layer 18 (aluminum or an aluminum alloy) and a transition metal layer 20 (which is Ti in the preferred embodiment). Interconnect 16 may consist of two to ten alternating layers of aluminum based material 18 and one to ten layers of transition metal 20, depending on design choice. In the FIG. 1 embodiment, two aluminum based layers 18 are used with a transition metal layer 20 between them.

Following deposition of metal interconnect 16, a relatively thin optically absorptive layer 22 is established on a top surface of interconnect 16. Absorptive layer 22 may be 200–2000 angstroms in thickness with a more preferred thickness of 200–1000 angstroms. Transition metals are the preferred material to be used for absorptive layer 22 as they are less conductive electrically than aluminum alloys and, therefore, absorb a larger portion of the incident radiant energy than aluminum absorbs. Even more preferred are the refractory transition metals which have the added advantage in that they have high boiling temperatures. Of the refractory metals, titanium, tantalum, molybdenum and tungsten are the preferred materials for absorptive layer 22. In the preferred imbodiment, absorptive layer 22 is titanium and is established from 200–1000 angstroms thick.

Figure 2:
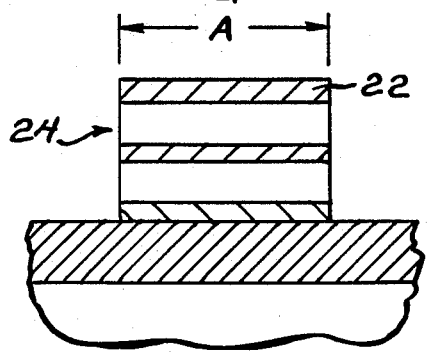

As shown in FIG. 2, the stack consisting of absorptive layer 22, underlying interconnect 16, and barrier 14 is then patterned using standard photolithographic and etch techniques to produce a fuse portion 24 having a preferred width of between 0.4 micron and 10.0 microns and a more preferred width of between 1.0 and 10.0 microns as indicated by arrow A in FIG. 2.

In some applications, it is desirable to remove absorptive layer 22 from portions of interconnect line 16 not intended to be used as a fuse (not shown). This may be accomplished by the addition of another photolithographic and etch step (not shown) leaving absorptive material of layer 22 on only the fuse portion of the interconnect. By limiting absorptive material to only the fuse portion, a greater portion of the optically absorbed energy is contained in the fuse rather than being dispersed along remaining non-fuse portions of the interconnect.

At this point, the fabrication of fuse 24 is complete. Standard wafer processing for integrated circuit manufacturing then continues—such as the formation of a passivation layer 26 by a conventional method that covers fuse 24 with a passivation layer ranging from 1 to 2 microns thick, as indicated by arrow B in FIG. 3. At an appropriate time, either during or after electrical testing of the integrated circuit is completed, a laser is used to vaporize selected metal fuses as needed either to disconnect defective elements or to customize a chip.

Figure 4A:
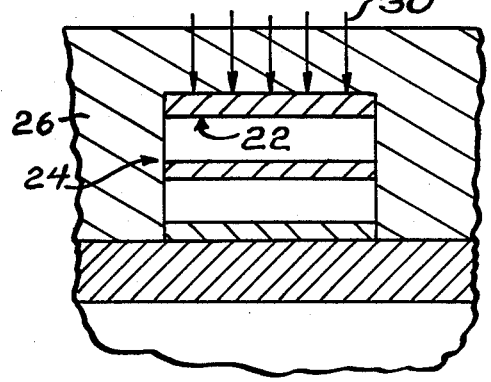
FIGS. 4a and 4b show the embodiment of FIG. 3 undergoing two possible fuse blowing operations.
Figure 3:
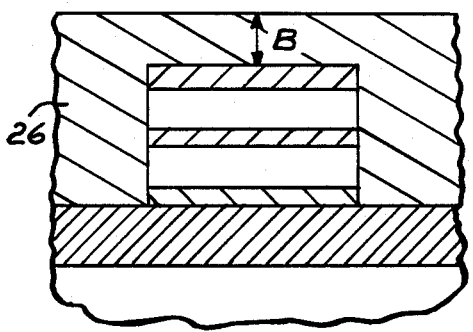
FIG. 3 shows the addition of a passivation layer to the embodiment of FIG. 2.

This improved fuse can be employed with some or all of the passivation left over the fuse to be blown. After selecting the fuse or fuses to be blown, as shown in FIG. 4a, a laser light beam 30 is directed through passivation layer 26 to strike absorptive layer 22 and thus blow fuse 24. According to the present invention, absorptive layer 22 forming the top layer of metal fuse 24 makes it possible to use a lower energy laser to blow fuse 24 than would otherwise be necessary without absorptive layer 22.

Figure 4B:
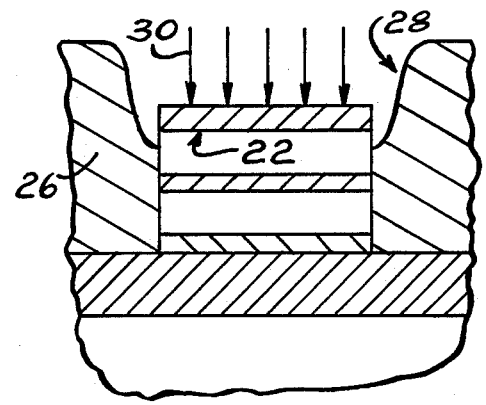

In another embodiment of this invention, as illustrated in FIG. 4b, a conventional photolithographic and etch operation is performed to create a window 28 exposing fuse 24 below. In particular, the etching operation is performed to expose absorptive layer 22. Laser light, as indicated by arrows 30, is then focused on absorptive layer 22.

According to the present invention, the same standard equipment used to blow polysilicon fuses is used to blow metal fuses having the optically absorptive layer. In the preferred embodiment, a single shot neodymium YAG (yttrium-aluminum-garnet) laser with a wavelength of 1.06 micrometers, a pulse width of 170 nanoseconds, and an energy of 1.5 microjoules is used to blow fuse 24. The laser has a focused circular output with a Gaussian energy distribution. Other lasers may be used, however, the laser and absorptive material should be selected such that the absorptive layer is optically absorptive at the frequency produced by the laser selected for use in the fuse blowing process.

Figure 5A:
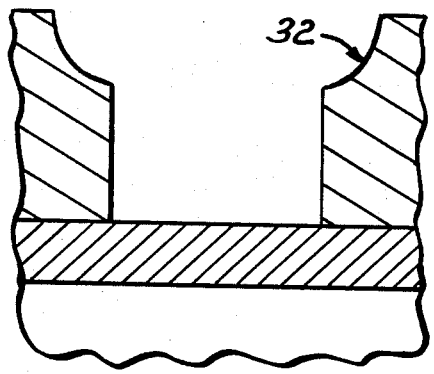
FIGS. 5a and 5b show the embodiments of FIGS. 4a and 4b following the respective fuse blowing operations.
Figure 5B:
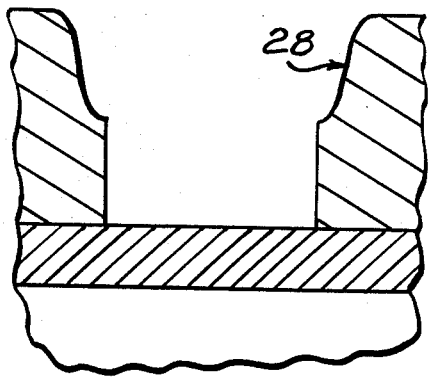

The majority of radiant energy absorbed by layer 22 is absorbed in the upper 50-300 angstroms thereof. Heat generated from the absorbed laser energy is conducted through fuse 24 thereby causing layers 16 and 14 of fuse 24 to melt. As the surface temperature rises, fuse 24 begins to evaporate. In the preferred embodiment, the surface temperature rises fast to rapidly raise the vapor pressure. Absorptive layer 22, with its higher boiling temperature than that of the underlying layers, acts as a cap to prevent evaporation until the vapor pressure of the fuse material contained below the cap is very high. Eventually the increased pressure below the cap cannot be contained. This results in an explosive reaction that removes the melted fuse material (as shown in FIGS. 5a and 5b which correspond to the embodiments of 4a and 4b) thereby producing an open electrical path having a substantially infinite resistance. For the embodiment of FIG. 4a, this explosive reaction also creates an opening 32 in the covering passivation layer as shown in FIG. 5a. For the embodiment shown in FIG. 4b, there is no passivation directly over the fuse. Therefore, the explosive reaction results in the fuse being blown away through previously formed opening 28 as shown in FIG. 5b.

Absorptive layer 22 enables a metal fuse to be cleanly removed by a low energy laser. The use of a low energy laser as a fuse blowing apparatus prevents damage from occurring to the silicon substrate and/or polysilicon structures below or nearby metal fuse 24. The use of a low energy laser also allows metal fuses to be closely spaced in accordance with the demand for increased density of integrated circuits. Spacings of 3 microns have been demonstrated. Smaller spacings are limited only by the ability to focus the laser output to correspondingly smaller dimensions.

Figure 6:
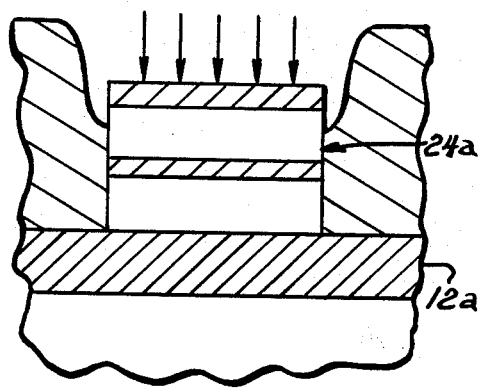
FIG. 6 shows a cross sectional view of another preferred embodiment of the novel metallic fuse.

It will be apparent to those skilled in the art that many alterations and modifications may be made to the described method without departing from the invention. By way of example only, there is shown in FIG. 6, another preferred embodiment according to the present invention which is formed according to the process as described with reference to FIGS. 1-3 and 4b, supra. In the embodiment of FIG. 6, however, a fuse 24a is formed directly on a dielectric layer 12a rather than on a diffusion barrier as shown in the embodiment illustrated in FIG. 1.

Figure 7:
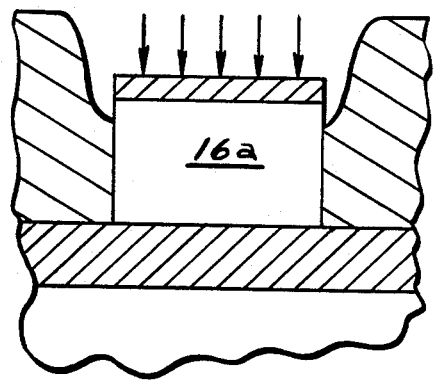
FIG. 7 shows a cross sectional view of yet another preferred embodiment of the novel metallic fuse according to the present invention.

Another such modification is that shown in FIG. 7 in which a metallic interconnect member 16a consists of a homogeneous layer of an aluminum alloy such as, for example, Al-Si, Al-Cu, Al-Si-Cu, or Al-Si-Ti rather than alternating layers of alloy with layers of transition metal. Many other such changes will be obvious to those skilled in the art. Accordingly, it is intended that all such modifications and alterations be considered as within the spirit and scope of the invention as defined by the appended claims.

What is claimed is:

1. A method of fabricating on a substrate surface a fuse forming an integral part of a metallic interconnect line joining elements in an integrated circuit, the method comprising:
    forming a metal interconnect layer above the substrate surface;
    forming a layer of an optically absorptive refractory transition metal above said metal interconnect layer, said refractory metal having a higher boiling point than said metal interconnect layer;
    defining said metal interconnect layer and said optically absorptive layer into a patterned metallic interconnect for the integrated circuit including a fuse portion therein, said refractory metal forming a cap to prevent evaporation of said fuse portion when said fuse portion is exposed to a directed energy source to increase the vapor pressure under the cap to produce an explosive removal of said fuse portion; and
    removing said fuse portion from said interconnect line by exposing said optically absorptive refractory metal to directed energy source that explosively removes said fuse portion without damaging the substrate.

2. A method as set forth in claim 1 wherein said metal interconnect layer comprises aluminum.

3. A method as set forth in claim 1 wherein said metal interconnect layer comprises an aluminum alloy.

4. A method as set forth in claim 1 wherein said step of forming a metal interconnect layer comprises forming a laminate product including a plurality of aluminum alloy layers each containing a respective one of a plurality of transition metal layers.

5. A method as set forth in claim 4 wherein said aluminum alloy comprises aluminum-silicon-titanium and said transition metal layer comprises titanium.

6. A method as set forth in claim 4 wherein said step of forming metal interconnect layer includes forming a diffusion barrier between the metal layer and the substrate surface, said diffusion barrier comprising a transition metal based bottom layer.

7. A method as set forth in claim 6 wherein said transition metal based bottom layer comprises titanium nitride.

8. A method as set forth in claim 1 wherein said optically absorptive metal comprises a transition metal.

9. A method as set forth in claim 1 wherein said optically absorptive metal is selected from the group consisting of titanium, tungsten, tantalum and molybdenum.

10. A method as set forth in claim 1 wherein said removing step comprises exposing said fuse portion to a laser beam.

11. A method as set forth in claim 10 wherein said laser beam is characterized by a circular Gaussian energy distribution output.

12. A method as set forth in claim 1 further including the steps of:
    after said fuse portion forming step, forming a passivation layer over said patterned metallic interconnect;
    testing the integrated circuit; and
    said removing step comprising directing a laser light having a circular Gaussian distribution of energy on said optically absorptive layer of said fuse to vaporize said fuse portion.

13. A method according to claim 12 wherein said passivation layer over said fuse portion is etched using a photolithographic etch technique to expose said optically absorptive layer prior to directing said laser to vaporize said fuse portion.

14. A method according to claim 12 wherein said optically absorptive metal is selected to be optically absorptive at the frequency of said laser light.

15. A method as set forth in claim 1 wherein said removing step includes the steps of:
    after said fuse portion forming step, removing said optically absorptive material from the top of said interconnect line from all but said fuse portion;

forming a passivation layer over said interconnect;
electrically testing the integrated circuit to locate a defective element; and
removing said fuse portion from said interconnect line associated with said defective element to create an open circuit by exposing said optically absorptive top layer of said fuse to said directed energy source that vaporizes said fuse portion without damaging said substrate.

16. A method according to claim 15 further including the step of etching an opening in said passivation layer to expose said optically absorptive layer of said fuse portion integral with said interconnect associated with said defective element prior to said removing step.

17. A method as set forth in claim 1 further including the step of:
after said fuse portion forming step, removing said fuse portion from said interconnect by directing a laser light on said exposed optically absorptive layer to melt said fuse portion.

18. The method of claim 1 wherein said optically absorptive layer is formed directly upon the top surface of and in contact with said metallic interconnect layer.

* * * * *